(12) United States Patent
Tsuchiya (10) Patent No.: US 10,748,778 B2
(45) Date of Patent: Aug. 18, 2020

(54) METHOD FOR POLISHING SILICON WAFER AND SURFACE TREATMENT COMPOSITION

(71) Applicant: FUJIMI INCORPORATED, Kiyosu-shi, Aichi (JP)

(72) Inventor: Kohsuke Tsuchiya, Aichi (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 16/285,580

(22) Filed: Feb. 26, 2019

(65) Prior Publication Data

US 2019/0189460 A1 Jun. 20, 2019

Related U.S. Application Data

(63) Continuation-in-part of application No. 15/549,488, filed as application No. PCT/JP2016/000321 on Jan. 22, 2016, now abandoned.

(30) Foreign Application Priority Data

Feb. 12, 2015 (JP) .................. 2015-025350
Apr. 22, 2015 (JP) .................. 2015-087601

(51) Int. Cl.
  *H01L 21/306* (2006.01)
  *H01L 21/02* (2006.01)
  (Continued)

(52) U.S. Cl.
  CPC .......... *H01L 21/30625* (2013.01); *B08B 3/08* (2013.01); *B08B 3/12* (2013.01);
  (Continued)

(58) Field of Classification Search
  CPC ........ H01L 21/30625; H01L 21/02057; C09G 1/02; B24B 37/044; B08B 3/08; B08B 3/12
  See application file for complete search history.

(56) References Cited

U.S. PATENT DOCUMENTS

2004/0127046 A1 7/2004 Takami
2005/0282718 A1 12/2005 Nakagawa
(Continued)

FOREIGN PATENT DOCUMENTS

DE 11 2013 000 578 T5 11/2014
EP 1 424 727 A1 6/2004
(Continued)

OTHER PUBLICATIONS

International Preliminary Report on Patentability cited in PCT/JP2016/000321 dated Aug. 15, 2017.

*Primary Examiner* — Duy Vu N Deo
*Assistant Examiner* — Mahmoud Dahimene
(74) *Attorney, Agent, or Firm* — Foley & Lardner LLP (57) ABSTRACT

There is provided a polishing method capable of more reducing defects on a silicon wafer surface. A polishing method of a silicon wafer, which includes a polishing step and a surface treatment step conducted after the polishing step and in which the number of abrasives in a surface treatment composition used in the surface treatment step is $1.0 \times 10^{10}$ particles/mL or more and $1.0 \times 10^{13}$ particles/mL or less by calculating from (1 [mL]×specific gravity of the composition [g/mL]×concentration of the abrasives [wt %])/ $((4/3)\pi \times ($average secondary particle diameter$\times 10^{-7}$ [cm]/$2)^3$ [/particle]×specific gravity of the abrasives [g/cm³]), using concentration of the abrasives in the surface treatment composition and an average secondary particle diameter measured by dynamic light scattering method, provided that all of the abrasives in the surface treatment composition (Continued)

used in the surface treatment step are assumed to have the average secondary particle diameter.

14 Claims, 1 Drawing Sheet

(51) Int. Cl.
*C09G 1/02* (2006.01)
*B24B 37/04* (2012.01)
*B08B 3/12* (2006.01)
*B08B 3/08* (2006.01)

(52) U.S. Cl.
CPC .............. *B24B 37/044* (2013.01); *C09G 1/02* (2013.01); *H01L 21/02024* (2013.01); *H01L 21/02052* (2013.01); *H01L 21/02057* (2013.01)

(56) References Cited

U.S. PATENT DOCUMENTS

| | | |
|---|---|---|
| 2008/0051010 A1 | 2/2008 | Uemura |
| 2009/0298393 A1 | 12/2009 | Kozasa |
| 2010/0003821 A1 | 1/2010 | Morinaga et al. |
| 2012/0080775 A1 | 4/2012 | Matsuda et al. |
| 2013/0109180 A1 | 5/2013 | Tanimoto et al. |
| 2015/0166838 A1 | 6/2015 | Tsuchiya et al. |
| 2015/0210892 A1 | 7/2015 | Tsuchiya et al. |
| 2016/0122591 A1 | 5/2016 | Tsuchiya et al. |
| 2016/0272846 A1* | 9/2016 | Tsuchiya ........... H01L 21/02024 |

FOREIGN PATENT DOCUMENTS

| | | |
|---|---|---|
| JP | 2006-005246 A | 1/2006 |
| JP | 2008-053415 A | 3/2008 |
| JP | 2009-290139 A | 12/2009 |
| JP | 2010-034509 A | 2/2010 |
| JP | 2011-165909 A | 8/2011 |
| JP | 2013-152775 A | 8/2013 |
| JP | 5310848 B2 | 10/2013 |
| WO | WO-2012/005289 A1 | 1/2012 |
| WO | WO-2014/034425 A1 | 3/2014 |
| WO | WO-2014/148399 A1 | 9/2014 |
| WO | WO-2014/163026 A1 | 10/2014 |
| WO | WO-2014/196299 A1 | 12/2014 |

* cited by examiner

METHOD FOR POLISHING SILICON WAFER AND SURFACE TREATMENT COMPOSITION

CROSS REFERENCE TO RELATED APPLICATIONS

This application is a continuation-in-part application of U.S. application Ser. No. 15/549,488, filed on Aug. 8, 2017, which is the National Stage of Application No. PCT/JP2016/000321 filed on Jan. 22, 2016, which is based upon and claims the benefit of priority from Japanese Application No. 2015-025350, filed Feb. 12, 2015 and Japanese Application No. 2015-087601, Filed Apr. 22, 2015, the entire contents of all of which are incorporated herein by reference.

TECHNICAL FIELD

The present invention relates to a polishing method of a silicon wafer, and particularly to a polishing method of a silicon wafer, including a surface treatment step conducted after a polishing step of the silicon wafer, and a surface treatment composition.

BACKGROUND ART

In order to realize high integration and high speed acceleration of an integrated circuit such as an ULSI or the like used in a computer, the fining of a design rule for a semiconductor device has been advancing year after year. With its fining, there have been increasing cases where more minute surface defects adversely affect the performance of the semiconductor device. It is becoming more important to manage nano-order defects which have not been treated heretofore as problems.

A semiconductor substrate such as a silicon wafer, and other substrates have recently been required to have a surface of higher quality. A consideration of a polishing composition capable of meeting such a request has been performed in various ways. A technology of using a low-viscosity water-soluble polymer compound as a semiconductor wetting agent to thereby make it easy to remove by filtration, foreign substances or the like which may lead to a factor of increasing the number of minute particles (Light Point Defect; LPD) on a semiconductor substrate after polishing has been described in, for example, Patent Literature 1. Also, a technology of reducing defects by a rinsing composition containing a water-soluble polymer such as water-soluble polysaccharide or the like has been described in Patent Literature 2. Further, a technology of controlling the number of abrasives in polishing liquid to be within a prescribed range to thereby obtain a high-quality surface with less defects has been described in Patent Literature 3. There was however a case where even such technologies were not capable of sufficiently coping with a recent request level related to surface quality after polishing.

CITATION LIST

Patent Literature

PTL 1: JP 2010-034509 A
PTL 2: JP 2006-005246 A
PTL 3: JP No. 5310848

SUMMARY OF INVENTION

Technical Problem

The present invention has an objective to provide a polishing method capable of more reducing defects on a silicon wafer surface, and particularly a polishing method including a surface treatment step conducted after a polishing step.

Solution to Problem

In order to solve the above problem, one embodiment of a polishing method of the present invention includes a polishing step and a surface treatment step conducted after the polishing step. The number of abrasives in a surface treatment composition used in the surface treatment step is assumed to be $1.0 \times 10^{10}$ particles/mL or more and $1.0 \times 10^{13}$ particles/mL or less as the number of the abrasives calculated by (1 [mL]×specific gravity of the surface treatment composition [g/mL]×concentration of the abrasives [wt %])/ $((4/3)\pi \times ($average secondary particle diameter$\times 10^{-7}$ [cm]/2$)^3$ [/particle]×specific gravity of the abrasives [g/cm$^3$] using the concentration of the abrasives in a surface treatment composition and the average secondary particle diameter measured by a dynamic light scattering method, provided that all of the abrasives in a surface treatment composition used in the surface treatment step are assumed to have average secondary particle diameter.

Also, another aspect of embodiment of the polishing method of the present invention may be configured to assume the number of abrasives in a polishing composition used in the polishing step to be $1.0 \times 10^{11}$ particles or more and less than $1.0 \times 10^{15}$ particles/mL. Alternatively, a value obtained by dividing the number of the abrasives in the surface treatment composition used in the surface treatment step by the number of the abrasives in the polishing composition used in the polishing step may be 0.00001 or more and 0.5 or less.

Further, a further aspect of embodiment of the polishing method of the present invention may be configured to assume the polishing step and the surface treatment step to be steps continuously carried out on the same surface plate.

Furthermore, a still further aspect of embodiment of the polishing method of the present invention provides a surface treatment composition used in the polishing method in the above aspect of embodiment.

Advantageous Effects of Invention

According to the present invention, it is possible to enhance a protective property of a wafer surface and reduce defects by a surface treatment step including polishing or rising of a silicon wafer.

DESCRIPTION OF EMBODIMENTS

Embodiments of the present invention will be described below. Incidentally, matters required for the implementation of the present invention, which are matters other than matters that are specifically mentioned in the present specification can be implemented as those within the scope of the present invention based on the technical common knowledge in the corresponding field.

A polishing step in a polishing method of one embodiment of the present invention may include so-called multi-stage polishing or a surface treatment. For example, the polishing step may include a lapping step (rough polishing step), a preliminary polishing step, and a final polishing step. Further, although the polishing method of the one embodiment of the present invention includes a polishing step and a surface treatment step done after the polishing step, the surface treatment step may be used in a surface treatment for improving a damage layer in a silicon wafer or may be used in rinse after a polishing treatment of the silicon wafer.

The surface treatment step according to the one embodiment of the polishing method of the present invention can be used in the same device and conditions as those used in the normal rinse of the silicon wafer. For example, the surface treatment step of the silicon wafer can be performed by rotating a pad and/or silicon wafer while in a state in which the pad is allowed to contact with the surface of the silicon wafer, supplying a rinsing composition to its contact surface.

The pad used in the one embodiment of the polishing method of the present invention may be those of any kind such as a non-woven fabric type, a suede type, etc. Also, the pad may be one containing or not containing abrasives.

The temperature at use of a surface treatment composition in the one embodiment of the polishing method of the present invention is not limited in particular, but may be 5 to 60° C.

The rinsing of the silicon wafer using the surface treatment composition in the one embodiment of the present invention can also be performed on the silicon wafer which remains attached to the device used in polishing immediately after the polishing of the silicon wafer. In this case, even though a basic compound is contained in a polishing composition remaining on the pad, it is possible to suppress the surface of the silicon wafer from roughening by the basic compound.

Although the composition for silicon wafer polishing, which is normally used can be used as the polishing composition used in the polishing step and the surface treatment composition used in the surface treatment step in the one embodiment of the present invention, the polishing composition and the surface treatment composition are changed in terms of the number of abrasives. That is, the compositions other than the number of the abrasives may be a polishing composition which can be used in the polishing step of the silicon wafer, and are not limited at all. The polishing composition in the one embodiment of the present invention includes as needed, for example, a basic compound, a water-soluble polymer, a chelating agent, a surfactant, other components, etc. in addition to the abrasives. These component compositions may be the same or changed in the polishing step and the surface treatment step. For example, the concentration of the component composition in the surface treatment step may be made lower than that in the polishing step. Although these components will hereinafter be described, they are illustrative and not limited to these.

Polishing Composition and Surface Treatment Composition (Abrasive)

The polishing composition used in the polishing step and the surface treatment composition used in the surface treatment step contain abrasives. The abrasives give physical action on the surface of a silicon wafer substrate to physically conduct polishing or perform a surface treatment such as cleaning or the like.

The content of the abrasives in the surface treatment composition used in the surface treatment step in the polishing method of the present invention is calculated by the number of the abrasives=(1 [mL]×specific gravity of the surface treatment composition [g/mL]×concentration of the abrasives [wt %])/((4/3)π×(average secondary particle diameter×$10^{-7}$ [cm]/2)$^3$ [/particle]×specific gravity of the abrasives [g/cm$^3$]) using the concentration of the abrasives in a surface treatment composition and the average secondary particle diameter measured by a dynamic light scattering method, provided that all of the abrasives in the surface treatment composition used in the surface treatment step are assumed to have average secondary particle diameter. The content of the abrasives in the surface treatment composition is $1.0\times10^{10}$ particles/mL or more and $1.0\times10^{13}$ particles/mL or less, but is preferably $5.0\times10^{10}$ particles/mL or more and $5.0\times10^{12}$ particles/mL or less, and more preferably $5.0\times10^{10}$ particles/mL or more and $3.5\times10^{12}$ particles/mL or less. For example the content of the abrasives may be $5.0\times10^{10}$ particles/mL or more and $3.0\times10^{12}$ particles/mL or less. By setting the content of the abrasives to this range, defects on the surface of the silicon wafer can be more reduced.

The content of the abrasives in the polishing composition used in the polishing step in the polishing method of the present invention calculated by the number of the abrasives=(1 [mL]×specific gravity of the polishing composition [g/mL]×concentration of the abrasives [wt %])/((4/3)π× (average secondary particle diameter×$10^{-7}$ [cm]/2)$^3$ [/particle]×specific gravity of the abrasives [g/cm$^3$]) using concentration of the abrasives in a polishing composition and average secondary particle diameter measured by a dynamic light scattering method, provided that all of the abrasives in the polishing composition used in the polishing step are assumed to have average secondary particle diameter may be $1.0\times10^{11}$ particles/mL or more and less than $1.0\times10^{15}$ particles/mL, preferably $1.0\times10^{12}$ particles/mL or more and less than $2.5\times10^{13}$ particles/mL. A high polishing rate is obtained by an increase in the content of the abrasives when polishing the silicon wafer substrate. The stability of the polishing composition is enhanced by a decrease in the content of the abrasives. By setting the content of the abrasives in the polishing composition to this range, defects on the surface of the silicon wafer can be more reduced by a subsequent surface treatment step while enhancing the polishing rate.

Note that the calculation formula of the number of the contents of the abrasives from the concentration of the abrasives in a composition and an average secondary particle diameter measured by a dynamic light scattering method is derived from following equations, provided that all of the abrasives are assumed to have average secondary particle diameter, where 3.1416 is used as the value of π.

The number of the abrasives per 1 mL [particle]=
(weight of the abrasives contained in 1 mL of the composition [g])/(weight of the abrasives per one particle [g/particle]

=(weight of 1 mL of the composition [g/mL]×concentration of the abrasives [wt %])/(volume of the abrasives per one particle [cm$^3$/particle]× specific gravity of the abrasives [g/cm$^3$])

=(1 [mL]×specific gravity of the composition [g/mL])×concentration of the abrasives [wt %])/ ((4/3)π×(average secondary particle diameter of the abrasives×$10^{-7}$ [cm]/2)$^3$[/particle]×specific gravity of the abrasives [g/cm$^3$])

Concentration of the abrasives in the surface treatment composition used in the surface treatment step of the present invention is selected depending on kinds of the abrasives, particle diameter, removing rate, dispersion stability and the like. For example, concentration of the abrasives may be 0.000005 wt % or more, 0.00001 wt % or more or 0.0001 wt % or more, and 1.5 wt % or less, 1 wt % or less, 0.5 wt % or less, 0.1 wt % or less, or 0.05 wt % or less with respect to the total weight of the surface treatment composition.

Concentration of the abrasives in the polishing composition used in the polishing step of the present invention is selected depending on kinds of the abrasives, particle diameter, removing rate, dispersion stability and the like. For example, concentration of the abrasives may be 0.00005 wt % or more, 0.0005 wt % or more, 0.005 wt % or more, 0.01 wt % or more, 0.05 wt % or more, 0.10 wt % or more or 0.15 wt % or more, and 10 wt % or less, 5 wt % or less, 1 wt % or less, 0.5 wt % or less or 0.25 wt % or less with respect to the total weight of the polishing composition.

A value obtained by dividing the number of the abrasives in the surface treatment composition used in the surface treatment step in the polishing method of the present invention by the number of the abrasives in the polishing composition used in the polishing step may be 0.00001 or more and 0.5 or less and further 0.001 or more and 0.2 or less. By setting the content of the abrasives in the polishing composition and the surface treatment composition to this range, defects on the surface of the silicon wafer can be more reduced.

A value obtained by dividing the concentration of the abrasives in the surface treatment composition used in the surface treatment step by the concentration of the abrasives in the polishing composition may be 0.00001 or more and 0.5 or less, and may be 0.001 or more and 0.2 or less. Defects on the surface of the silicon wafer can be more reduced by setting the contents of the abrasives in the polishing composition and the surface treatment composition to this range.

As examples of the abrasives, there may be mentioned an inorganic particle, an organic particle, and an organic/inorganic composite particle. As specific examples of the inorganic particle, there may be mentioned oxide particles such as a silica particle, an alumina particle, a cerium oxide particle, a chromium oxide particle, a titanium dioxide particle, a zirconium oxide particle, a magnesium oxide particle, a manganese dioxide particle, a zinc oxide particle, a red iron oxide, etc., nitride particles such as a silicon nitride particle, a boron nitride particle, etc., carbide particles such as a silicon carbide particle, a boron carbide particle, etc., carbonate such as a diamond particle, calcium carbonate, barium carbonate, etc. and the like. As a specific example of the organic particle, there may be mentioned, for example, a polymethyl methacrylate (PMMA) particle.

Silica is preferred even among these specific examples. As specific examples of silica, there may be mentioned a silica particle selected from colloidal silica, fumed silica, and sol-gen process silica. Even among these silica particles, the silica particle selected from the colloidal silica and the fumed silica, particularly the colloidal silica is preferably used in the viewpoint of reducing scratches generated on the polishing surface of the silicon wafer substrate. One kind of these may be used alone, or two or more kinds may be used in combination.

The true specific gravity of silica is preferably 1.5 or more, more preferably 1.6 or more, further preferably 1.7 or more. A high polishing rate is obtained by an increase in the true specific gravity of silica when polishing the silicon wafer substrate. The true specific gravity of silica is preferably 2.2 or less, more preferably 2.0 or less, further preferably 1.9 or less. With a decrease in the silica true specific gravity, there is the action of improving the quality of the surface of the silicon wafer substrate after polishing. Specifically, there is a haze improving effect or the like. The true specific gravity of silica is calculated from a weight at which the particle of silica is dried, and a weight at which the particle of silica is filled with ethanol already known in capacity.

The average primary particle diameter of the abrasive is preferably 5 nm or more, more preferably 10 nm or more, further preferably 20 nm or more. A high polishing rate is obtained by an increase in the average primary particle diameter of the abrasive when polishing the silicon wafer substrate. The average primary particle diameter of the abrasive is preferably 100 nm or less, more preferably 70 nm or less, further preferably 50 nm or less. The stability of the polishing composition is improved by a decrease in the average primary particle diameter of the abrasive.

The value of the average primary particle diameter of the abrasive is calculated from a specific surface area measured by, for example, a BET method. The measurement of the specific surface area of the abrasive can be performed using, for example, "FlowSorbII 2300" manufactured by Micromeritics Instrument Corporation.

The average secondary particle diameter of the abrasive is preferably 10 nm or more, more specifically 20 nm or more, further preferably 30 nm or more. A high polishing rate is obtained by an increase in the average secondary particle diameter of the abrasive when polishing the silicon wafer substrate. The average secondary particle diameter of the abrasive is preferably 200 nm or less, more preferably 150 nm or less, further preferably 100 nm or less. The stability of the polishing composition is improved by a decrease in the average secondary particle diameter of the abrasive. The average secondary particle diameter of the abrasive can be measured by a dynamic light scattering method. As the dynamic light scattering method, frequency analysis which is called a heterodyne detecting method to capture weak scattered light and reference wave by a mixture light detector as electrical signals, and to obtain power spectrum from the electrical signals is used. For example, the average secondary particle diameter of the abrasive can be measured by the dynamic light scattering method using the type "UPA-UT151" manufactured by Nikkiso Co. Ltd.

An average value of a major axis/minor axis ratio of the abrasive is preferably 1.0 or more, more preferably 1.05 or more, further preferably 1.1 or more. A high polishing rate is obtained by an increase in the average value of the above major axis/minor axis ratio. The average value of the major axis/minor axis ratio of the abrasive is 3.0 or less, more preferably 2.0 or less, further preferably 1.5 or less. Scratches generated on the polishing surface of the silicon wafer substrate is reduced by a decrease in the average value of the above major axis/minor axis ratio.

The above major axis/minor axis ratio is a value indicative of a particle shape of the abrasive, and can be determined by, for example, a photographic observation using an electron microscope. Specifically, a scanning electron microscope is used to observe a predetermined number (e.g., 200) of abrasives and draw the minimum rectangle circumscribed to each particle image. Further, as to the rectangles drawn with respect to the respective particle images, values each obtained by dividing the length of its long side (value of its major axis) by the length of its short side (value of its minor axis) are calculated, and an average value of the values is calculated, thereby making it possible to determine an average value of a major axis/minor axis ratio.

(Basic Compound)

A basic compound can be contained in the polishing composition. The basic compound exerts chemical action to the polishing surface of the silicon wafer substrate to chemically polish the same (chemical etching). Thus, it becomes easy to improve the polishing rate when polishing the silicon wafer substrate.

As specific examples of the basic compound, there may be mentioned an inorganic basic compound, an alkali metal or alkali earth metal hydroxide or salt, a quaternary ammonium hydroxide or salt, ammonia, amine, etc. As specific examples of the alkali metal, there may be mentioned potassium, sodium, etc. As specific examples of the salt, there may be mentioned carbonate, hydrogen carbonate, sulfate, acetate, etc. As specific examples of the quaternary ammonium, there may be tetramethyl ammonium, tetraethyl ammonium, tetrabutyl ammonium, etc. As specific examples of the alkali metal hydroxide or salt, potassium hydroxide, potassium carbonate, potassium hydrogen carbonate, potassium sulfate, potassium acetate, potassium chloride, etc. As specific examples of the quaternary ammonium hydroxide or its salt, there may be mentioned tetramethyl ammonium hydroxide, tetraethyl ammonium hydroxide, tetrabutyl ammonium hydroxide, etc. As specific examples of the amine, there may be mentioned methylamine, dimethylamine, trimethylamine, ethylamine, diethylamine, triethylamine, ethylenediamine, monoethanolamine, N-(β-aminoethyl) ethanolamine, hexamethylenediamine, diethylenetriamine, triethylenetetramine, anhydrous piperazine, piperazine hexahydrate, 1-(2-aminoethyl) piperazine, N-methyl piperazine, guanidine, azoles such as imidazole, triazole, etc., and the like. These basic compounds may be used alone as one kind or in combination of two or more kinds.

Even among the basic compounds, preferred is at least one kind selected from ammonia, ammonium salt, an alkali metal hydroxide, alkali metal salt, and a quaternary ammonium hydroxide. Even among the basic compounds, more preferred is at least one kind selected from ammonia, potassium hydroxide, sodium hydroxide, tetramethyl ammonium hydroxide, tetraethyl ammonium hydroxide, ammonium hydrogen carbonate, ammonium carbonate, potassium hydrogen carbonate, potassium carbonate, sodium hydrogen carbonate, and sodium carbonate. Even among the basic compounds, at least one kind selected from ammonia, potassium hydroxide, sodium hydroxide, tetramethyl ammonium hydroxide, and tetraethyl ammonium hydroxide is further preferred. More preferred is at least one of ammonia and tetramethyl ammonium hydroxide, and most preferred is ammonia.

The content of the basic compound in the polishing composition and the surface treatment composition is preferably 0.001 mass % or more, more preferably 0.002 mass % or more, further preferably 0.003 mass % or more. With an increase in the content of the basic compound in the polishing composition, a high polishing rate tends to be obtained when polishing the silicon wafer substrate. The content of the basic compound in the polishing composition is preferably 1.0 mass % or less, more preferably 0.5 mass % or less, further preferably 0.2 mass % or less, most preferably 0.1 mass % or less. The shape of the silicon wafer substrate tends to be easily maintained by a decrease in the content of the basic compound in the polishing composition.

The pH of the polishing composition is preferably 8.0 or more, more preferably 8.5 or more, further preferably 9.0 or more. A high polishing rate tends to be obtained by an increase in the pH of the polishing composition when polishing the silicon wafer substrate. The pH of the polishing composition is preferably 11.0 or less, more preferably 10.8 or less, further preferably 10.5 or less. There exists a tendency that the roughness of the silicon wafer substrate can be reduced by a decrease in the pH of the polishing composition.

(Water)

Water becomes a dispersion medium or solvent of other components. In order to avoid as much as possible that the action of other components contained in the polishing composition is blocked by water, for example, the total content of transition metal ions in water is preferably 100 ppb or less. The purity of water can be enhanced by, for example, operations such as removal of impurity ions using an ion exchange resin, removal of particles by a filter, distillation, etc. Specifically, ion exchange water, pure water, ultrapure water, distilled water, etc. are preferably used.

(Water-Soluble Polymer)

The water-soluble polymer enhances surface wettability of the polishing surface of the silicon wafer substrate upon surface treatment of the silicon wafer substrate such as upon polishing, rinse treatment or the like. The polishing composition contains as the water-soluble polymer, a water-soluble polymer of a solid raw material fed into water in a state of a solid object or a solid at the time of preparation of the polishing composition. The solid raw material means one in a state of being visually a solid object or solid under environments of a temperature of 23° C., a relative moisture of 50%, and 1 atm in a state of a raw material before being soluble in water. Further, the water-soluble polymer is one synthesized from monomers in water or a mixed solvent of water and a water-based organic solvent such as alcohol, ketone or the like, but contains one in the form of water-based liquid as being in its solution state, or one in the form of an aqueous solution in which a volatile solvent is evaporated. Incidentally, the "water-soluble polymer of solid raw material", "water-soluble polymer of water-based form", and "water-soluble polymer of aqueous solution form" will simply be described below as the "water-soluble polymer".

As the water-soluble polymer, one having in a molecule, at least one kind of functional group selected from a cationic group, an anionic group, and a nonionic group, specifically, any of those containing in a molecule, a hydroxyl group, a carboxyl group, an acyloxy group, a sulfo group, an amide group, an amidino group, an imino group, an imide group, a quaternary nitrogen structure, a heterocyclic structure containing the functional group unit, a vinyl structure, a polyoxyalkylene structure, etc. can be used. As specific examples, there may be mentioned a cellulose derivative, polyvinyl alcohol, poly(meth)acrylic acid, poly(meth)acrylamidoalkylsulfonic acid, polyisoprenesulfonic acid, polyvinylsulfonic acid, polyallylsulfonic acid, polyisoamylenesulfonic acid, polystyrene sulfonate, poly(meth)acrylamide, polyalkylaminoalkyl(meth)acrylamide, polyvinylpyrrolidone, a copolymer including polyvinylpyrrolidone in part of its structure, polyvinyl caprolactam, a copolymer containing polyvinyl caprolactam in part of its structure, imine derivatives of polyalkoxyalkyl (meth)acrylamide, polyhydroxyalkyl(meth)acrylamide, poly(meth)acryloylmorpholine, polyamidine, polyethylene imine, hydrophilized polyimide, various polyamino acids, poly (N-acylalkyleneimine), etc., a polyvinyl alcohol derivative in which part of hydroxy groups of polyvinyl alcohol is substituted into a quaternary nitrogen structure, polyoxyethylene, a polymer having a polyoxyalkylene structure, a polymer having plural kinds of structure like these diblock, triblock, random and alternate types, etc. Incidentally, the notation of poly(meth)acrylic acid means acrylic acid and/or methacrylic acid, and other compounds are also similar.

Even among the above water-soluble polymers, the cellulose derivative, polyvinyl alcohol, polyvinylpyrrolidone, polyacryloylmorpholine, or a polymer having the polyoxyalkylene structure is preferred from the viewpoint of an improvement in surface wettability at the polishing surface of the silicon wafer substrate, suppression of the adhesion of particles, and a reduction in surface roughness, etc. As specific examples of the cellulose derivative, there may be mentioned hydroxyethyl cellulose, hydroxypropyl cellulose, hydroxyethylmethyl cellulose, hydroxypropylmethyl cellulose, methyl cellulose, ethyl cellulose, ethylhydroxyethyl cellulose, carboxymethyl cellulose, etc. Even among the cellulose derivatives, hydroxyethyl cellulose is particularly preferred from the viewpoint that it is high in capability of providing surface wettability to the polishing surface of the silicon wafer substrate and has good detergency. Further, as to the water-soluble polymer, one kind may be used alone, or two or more kinds may be used in combination.

The weight average molecular weight of the water-soluble polymer is preferably 1000 or more, more preferably 10000 or more, further preferably 50000 or more, most preferably 100000 or more in terms of polyethylene oxide. The surface wettability of the polishing surface of the silicon wafer substrate tends to be enhanced by an increase in the weight average molecular weight of the water-soluble polymer. The weight average molecular weight of the water-soluble polymer is preferably 2000000 or less, more preferably 1500000 or less, further preferably 1000000 or less. The stability of the polishing composition tends to be more maintained by a decrease in the weight average molecular weight of the water-soluble polymer. Also, the haze level of the polishing surface of the silicon wafer substrate tends to be further reduced.

The content of the water-soluble polymer in the polishing composition and the surface treatment composition is preferably 0.002 mass % or more, more preferably 0.004 mass % or more, further preferably 0.006 mass % or more, furthermore preferably 0.008 mass % or more, most preferably 0.01 mass % or more. The surface wettability of the polishing surface of the silicon wafer substrate tends to be more improved by an increase in the content of the water-soluble polymer in the polishing composition. The content of the water-soluble polymer in the polishing composition is preferably 0.5 mass % or less, more preferably 0.2 mass % or less, further preferably 0.1 mass % or less, furthermore preferably 0.05 mass % or less, most preferably 0.03 mass % or less. The stability of the polishing composition tends to be more maintained by a decrease in the content of the water-soluble polymer in the polishing composition.

(Chelating Agent)

A chelating agent can be contained in the polishing composition and the surface treatment composition. The chelating agent suppresses metal contamination in the silicon wafer substrate by capturing metal impurity components in a polishing system to form a complex.

As specific examples of the chelating agent, there may be mentioned an aminocarboxylic acid-based chelating agent and an organic phosphonic acid-based chelating agent. As specific examples of the aminocarboxylic acid-based chelating agent, there may be mentioned ethylanediaminetetraacetic acid, sodium ethylenediamine tetraacetate, nitrilotriacetic acid, sodium nitrilotriacetate, ammonium nitrilotriacetate, hydroxyethylethylenediamine triacetate, sodium hydroxyethylethylenediamine triacetate, diethylene triaminepentaacetic acid, sodium diethylenetriamine pentaacetate, triethylenetetramine hexaacetic acid, and sodium triethylenetetramine haxaacetate. As specific examples of the organic phosphonic acid-based chelating agent, there may be mentioned 2-aminoethylphosphonic acid, 1-hydroxyethylidene-1, 1-diphosphonic acid, aminotri (methylene phosphonic acid), ethylenediamine tetrakis (methylene phosphonic acid), diethylenetriaminepenta (methylene phosphonic acid), ethane-1, 1, -diphosphonic acid, ethane-1, 1, 2-triphosphonic acid, ethane-1-hydroxy-1, 1-diphosphonic acid, ethane-1-hydroxy-1, 1, 2-triphosphonic acid, ethane-1, 2-dicarboxy-1, 2-diphosphonic acid, methanehydroxy phosphonic acid, 2-phosphonobutane-1, 2-dicarbonic acid, 1-phosphonobutane-2, 3, 4-tricarbonic acid, and α-methylphosphono succinic acid. Even among these chelating agents, the organic phosphonic acid-based chelating agent, particularly, ethylenediamine tetrakis (methylene phosphonic acid) is preferably used. The chelating agents may be used alone as one kind or in combination of two or more kinds.

(Surfactant)

A surfactant can be contained in the polishing composition and the surface treatment composition. The surfactant suppresses the roughness of the polishing surface of the silicon wafer substrate. Thus, it becomes easy to reduce the haze level of the polishing surface of the silicon wafer substrate. Particularly when the basic compound is contained in the polishing composition, the roughness tends to easily occur in the polishing surface of the silicon wafer substrate by chemical etching based on the basic compound. Therefore, the combined use of the basic compound with the surfactant is especially effective.

As the surfactant, there may be mentioned an anionic or nonionic surfactant. Even among the surfactants, the nonionic surfactant is suitably used. Since the nonionic surfactant is low in foamability, the nonionic surfactant becomes easy to be handled upon the preparation or use of the polishing composition. Further, for example, pH adjustment becomes easier than when an ionic surfactant is used.

As specific examples of the nonionic surfactant, there may be mentioned an oxyalkylene homopolymer, a plurality of kinds of oxyalkylene copolymers, and a polyoxyalkylene adduct. As specific examples of the oxyalkylene homopolymer, there may be mentioned polyoxyethylene, polyethylene glycol, polyoxypropylene, and polyoxybutylene. As specific examples of the plurality of kinds of oxyalkylene copolymers, there may be mentioned polyoxyethylene polyoxypropylene glycol and polyoxyethylene polyoxypropylene glycol.

As specific examples of the polyoxyalkylene adduct, there may be mentioned polyoxyethylene alkyl ether, polyoxyethylene alkyl phenyl ether, polyoxyethylene alkyl amine, polyoxyethylene fatty acid ester, polyoxyethylene glyceryl ether fatty acid ester, polyoxyethylene sorbitan fatty acid ester, etc. Further, specifically, there may be mentioned a polyoxyethylene polyoxypropylene copolymer, polyoxyethylene glycol, polyoxyethylene propyl ether, polyoxyethylene butyl ether, polyoxyethylene pentyl ether, polyoxyethylene hexyl ether, polyoxyethylene octyl ether, polyoxyethylene-2-ethylhexyl ether, polyoxyethylene nonyl ether, polyoxyethylene decyl ether, poloxyethylene isodecyl ether, polyoxyethylene tridecyl ether, polyoxyethylene lauryl ether, polyoxyethylene cetyl ether, polyoxyethylene stearyl ether, polyoxyethylene isostearyl ether, polyoxyethylene oleyl ether, polyoxyethylene phenyl ether, polyoxyethylene octylphenyl ether, polyoxyethylene nonylphenyl ether, polyoxyethylene dodecylphenyl ether, polyoxyethylene styrenated phenyl ether, polyoxyethylene lauryl amine, polyoxyethylene stearyl amine, polyoxyethylene oleyl amine, polyoxyethylene stearyl amide, polyoxyethylene oleyl amide, polyoxyethylene monolauric acid ester, polyoxyethylene monostearic acid ester, polyoxyethylene distearic acid ester, polyoxyethylene monooleic acid ester, polyoxyethylene dioleic acid ester, polyoxyethylene sorbitan monolaurate, polyoxyethylene sorbitan monopaltiminate, polyoxyethylene sorbitan monostearate, polyoxyethylene sorbitan monooleate, polyoxyethylene sorbitan trioleate, polyoxyethylene sorbitol tetraoleate, polyoxyethylene castor oil, polyoxyethylene hydrogenated castor oil, etc.

Even among these nonionic surfactants, the oxyalkylene homopolymer or the plural kinds of oxyalkylene copolymers are preferably used. In this case, it is easy to reduce haze on the polishing surface of the silicon wafer substrate after polishing to a level practically suitable in particular. It is thought to be because an ether linkage having slight hydrophilicity and an alkylene group having slight hydrophobicity alternately exist in molecule chains of these polymers.

Further, the ratio of oxyethylene units in the oxyalkylene homopolymer or the plural kinds of oxyalkylene copolymers is preferably 85 mass % or more, more preferably 90 mass % or more. There is a tendency that the adhesion of particles relative to the polishing surface of the silicon wafer substrate after polishing is suppressed by an increase in the ratio of the oxyethylene units in the polymer.

The molecular weight of the surfactant is typically less than 10000 and preferably 9500 or less from the viewpoint of filterability of the polishing composition and detergency of an object to be polished, etc. Further, the molecular weight of the surfactant is typically 200 or more, preferably 250 or more from the viewpoint of a haze reduction effect or the like, more preferably 300 or more. Incidentally, as the molecular weight of the surfactant, a weight average molecular weight (Mw) (in terms of aqueous, polyethylene glycol) determined by GPC, or a molecular weight calculated from a chemical formula can be adopted.

The more preferable range of the molecular weight of the surfactant can differ even depending on the type of surfactant. For example, when a block copolymer of polyoxyethylene and polyoxypropylene is used as the surfactant, Mw is preferably 1000 or more, more preferably 2000 or more, further preferably 5000 or more.

Further, the HLB (hydrophile-lipophile Balance) value of the nonionic surfactant is preferably 8 or more, more preferably 10 or more, further preferably 12 or more. There is a tendency that the adhesion of particles to the polishing surface of the silicon wafer substrate after polishing is suppressed by an increase in the HLB value of the nonionic surfactant.

Incidentally, the surfactants may be used alone as one kind or in combination of two or more kinds. The content of the surfactant in the polishing composition is preferably 0.0001 mass % or more, more preferably 0.001 mass % or more. The haze on the surface of a semiconductor substrate after polishing tends to be more reduced by an increase in the content of the surfactant. The content of the surfactant in the polishing composition is preferably 0.05 mass % or less, more preferably 0.02 mass % or less. There is a tendency that the adhesion of particles to the polishing surface of the silicon wafer substrate after polishing is suppressed by a decrease in the content of the surfactant.

(Other Components)

The polishing composition may further contain known additives generally contained in the polishing composition as needed, e.g., organic acid, organic acid salt, inorganic acid, inorganic acid salt, an antiseptic agent, an antifungal agent, etc. For example, when any of the organic acid, organic acid salt, inorganic acid, and inorganic acid salt is added, it is possible to improve the hydrophilicity of the polishing surface of the silicon wafer substrate after polishing by the interaction with the water-soluble polymer.

As specific examples of the organic acid, there may be mentioned fatty acid such as formic acid, acetic acid, propionic acid or the like, aromatic carboxylic acid such as benzoic acid, phthalic acid or the like, citric acid, oxalic acid, tartaric acid, malic acid, maleic acid, fumaric acid, succinic acid, organic sulfonic acid, organic phosphonic acid, etc. As specific examples of the organic acid salt, there may be mentioned alkali metal salt such as organic acid sodium salt and potassium salt or the like, or ammonium salt described in the specific examples of the organic acid.

As specific examples of the inorganic acid, there may be mentioned sulfuric acid, nitric acid, hydrochloric acid, carbonic acid, etc. As specific examples of the inorganic acid salt, alkali metal salt such as inorganic acid sodium salt and potassium salt or the like, or ammonium salt described in the specific examples of the inorganic acid.

Even in the organic acid salt and the inorganic acid salt, ammonium salt is preferred from the viewpoint of suppressing metallic contamination of the silicon wafer substrate.

The organic acid and its salt, and the inorganic acid and its salt may be used alone as one kind or in combination of two or more kinds.

The action of the surface treatment composition in the present embodiment will next be described.

It has heretofore been known that the aqueous solution of the water-soluble polymer is useful as the surface treatment composition in the rinse step or the like. It is considered that this is because the surface of the silicon wafer substrate is protected by the water-soluble polymer to thereby protect the silicon wafer surface. The present inventors have found that as a result of intensive research, the protective property of the surface of the silicon wafer substrate can be drastically improved by containing a suitable amount of abrasives in the surface treatment step.

The action of imparting hydrophilicity to the substrate surface by the water-soluble polymer is exhibited by absorption of the water-soluble polymer on the substrate surface. However, in order to absorb the water-soluble polymer on the substrate surface, it becomes important to cause silicon dioxide to function as a carrier. That is, the water-soluble polymer is placed in a state of being absorbed on the surface of silicon dioxide in the polishing composition, so that the water-soluble polymer absorbed on the surface of the silicon dioxide is migrated to the substrate surface upon polishing when the silicon dioxide and the substrate surface rub against each other. Thus, it is possible to efficiently absorb the water-soluble polymer on the substrate surface. As a result, the hydrophilicity imparted to the substrate surface can effectively be improved. It becomes easy to suppress minute surface defects occurring in the substrate. Incidentally, when the water-soluble polymer is absorbed on the substrate surface, a hydrophobic bond is considered to have occurred between the substrate and each carbon of the water-soluble polymer.

Polishing Device

Figure 1:
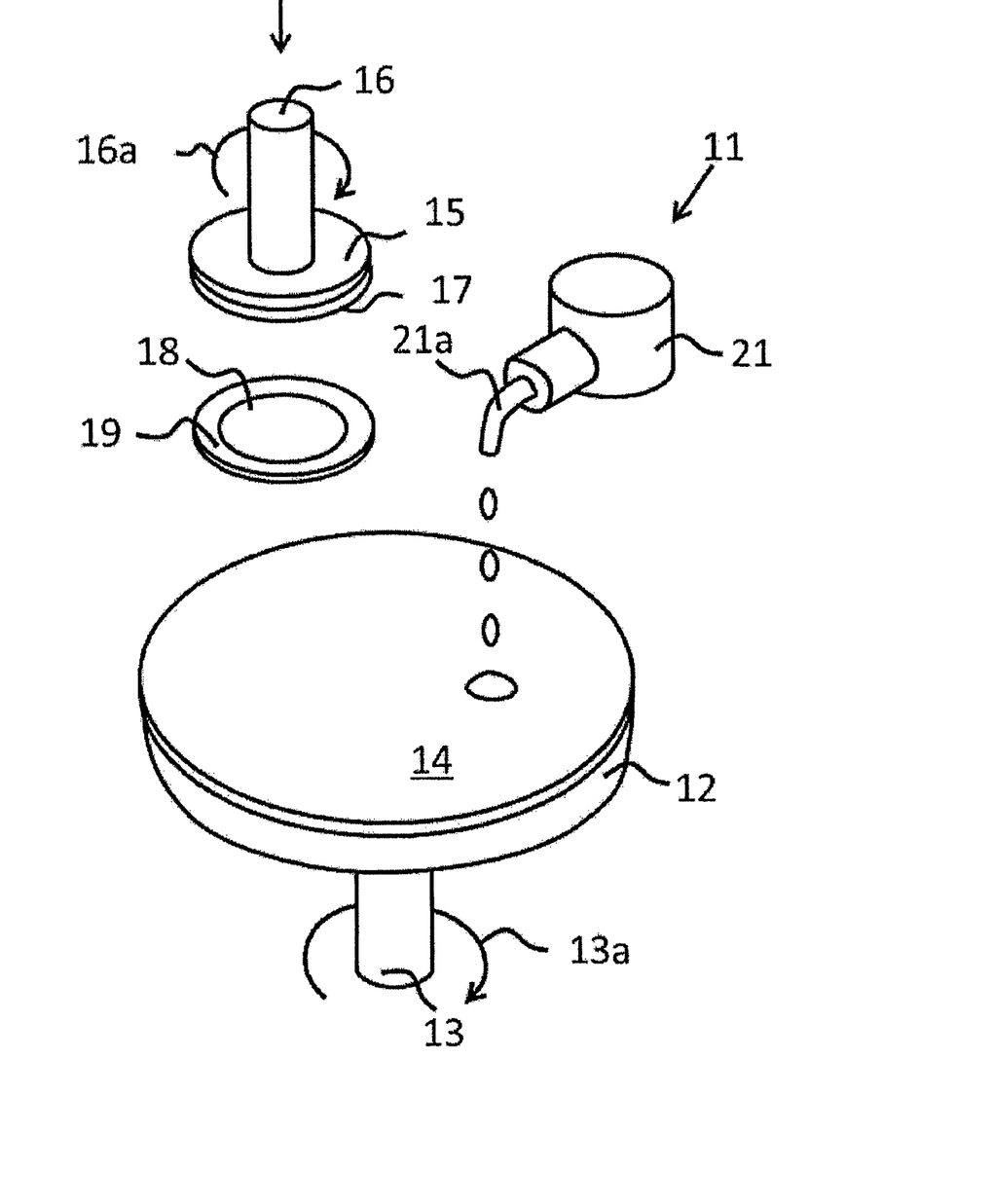
FIG. 1 is a perspective view illustrative of a one-side polishing device according to one embodiment of the present invention.

A polishing device will next be described. FIG. 1 is a perspective view illustrating a one-surface polishing device according to one embodiment of the present invention.

The polishing device 11 is equipped with a disk-shaped rotary surface plate 12 with a polishing pad 14 stuck to its upper surface. The rotary surface plate 12 is provided to be rotatable integrally with a first shaft 13 rotated in a direction indicated by an arrow 13a in FIG. 1. At least one wafer holder 15 is provided above the rotary surface plate 12. The wafer holder 15 is provided to be rotatable integrally with a second shaft 16 rotated in a direction indicated by an arrow 16a in FIG. 1. A wafer holding plate 19 having a wafer holding hole 18 is detachably mounted onto the bottom face of the wafer holder 15 through a ceramic plate 17 and an unillustrated urethane sheet. The polishing device 11 is further equipped with a polishing composition supplier 21 and an unillustrated rinsing composition supplier. The polishing composition supplier 21 discharges a polishing composition through a nozzle 21a, and the rinsing composition supplier discharges a rinsing composition through an unillustrated nozzle. Either one of the polishing composition supplier 21 and the rinsing composition supplier is arranged above the rotary surface plate 12. One of the suppliers, which is arranged above the rotary surface plate 12, and the other thereof not arranged above the rotary surface plate 12 are replaceable with each other.

Polishing, Surface Treatment and Cleaning Method

When a silicon wafer is polished, the polishing composition supplier 21 is arranged above the rotary surface plate 12 as illustrated in FIG. 1. The silicon wafer to be polished is absorbed in the wafer holding hole 18 and held on the wafer holder 15. First, the rotation of the wafer holder 15 and the rotary surface plate 12 is started, and the polishing composition is discharged from the polishing composition supplier 21 and supplied onto the polishing pad 14. Then, the wafer holder 15 is moved to the rotary surface plate 12 to press the silicon wafer against the polishing pad 14. Thus, the surface of the silicon wafer which makes contact with the polishing pad 14 is polished.

Subsequently, when the polished silicon wafer is surface-treated, a composition supplier for surface treatment is arranged above the rotary surface plate 12 instead of the polishing composition supplier 21. After the operating condition of the polishing device 11 is switched from a setting for polishing to a setting for surface treatment, a surface treating composition is discharged from the composition supplier for the surface treatment, and the surface treating composition is supplied onto the polishing pad 14. Thus, the surface of the silicon wafer which makes contact with the polishing pad 14 is surface-treated.

The polishing of the silicon wafer surface is preferably performed separately in plural stages. For example, the surface treatment may be performed through a first stage of rough-polishing and a second stage of precise polishing, or the surface treatment may be performed after finish polishing is done after the precise polishing. Thereafter, cleaning may be carried out as needed.

Examples

Using a polishing composition and a surface treatment composition each containing an abrasive (colloidal silica), a water-soluble polymer (hydroxyethyl cellulose: HEC, polyvinyl alcohol: PVA, polyacryloyl morpholine: PACMO), a surfactant (polyoxyethylene decyl ether: C10PEO5 only for an example 8, polyethyleneoxide-polypropyleneoxide-polyethyleneoxide: PEO-PPO-PEO only for an example 9), and a polishing composition and a surface treatment composition containing a basic compound (ammonia), which have kinds and contents illustrated in Table 1 respectively, a silicon wafer with a diameter of 300 mm was polish-treated and surface-treated and cleaned following it under the following conditions. Incidentally, in a comparative example 3, the surface treatment was performed under only pure water. In a comparative example 4, only a polishing step was substantially performed and completed.

Incidentally, the light scattering particle diameter of colloidal silica in Table is a volume average particle diameter measured using the type "UPA-UT151" manufactured by Nikkiso Co., Ltd. with a dispersion liquid of the above colloidal silica as a measuring sample.

TABLE 1

| | Polishing | | | | | | | | | | |
|---|---|---|---|---|---|---|---|---|---|---|---|
| | Silica | | | | Water-soluble polymer | | | Surfactant | | | Basic compound | |
| | Aberage primary particle diameter [nm] | Light scattering particle diameter [nm] | Number of particles [particles/cm$^3$] | Concentration [wt %] | Kind | Weight average molecular weight | Concentration [wt %] | Kind | Weight average molecular weight | Concentration [wt %] | Kind | Concentration [wt %] |
| Example 1 | 35 | 67 | 1.4E+13 | 0.40 | HEC | 250,000 | 0.017 | nil | — | — | ammonia | 0.009 |
| Example 2 | 35 | 67 | 1.4E+13 | 0.40 | HEC | 250,000 | 0.017 | nil | — | — | ammonia | 0.009 |
| Example 3 | 23 | 46 | 1.6E+13 | 0.15 | HEC | 250,000 | 0.009 | nil | — | — | ammonia | 0.005 |
| Example 4 | 12 | 21 | 4.5E+14 | 0.40 | HEC | 250,000 | 0.017 | nil | — | — | ammonia | 0.009 |
| Example 5 | 35 | 67 | 2.8E+13 | 0.79 | HEC | 250,000 | 0.017 | nil | — | — | ammonia | 0.009 |
| Example 6 | 35 | 67 | 1.4E+13 | 0.40 | HEC | 250,000 | 0.017 | nil | — | — | ammonia | 0.009 |
| Example 7 | 35 | 67 | 1.4E+13 | 0.40 | HEC | 250,000 | 0.017 | nil | — | — | ammonia | 0.009 |
| Example 8 | 35 | 67 | 1.4E+13 | 0.40 | HEC | 250,000 | 0.017 | nil | — | — | ammonia | 0.009 |
| Example 9 | 35 | 67 | 1.4E+13 | 0.40 | PACMO PVA | 600,000 100,000 | 0.008 0.008 | PEO-PPO-PEO | 9000 | 0.001 | ammonia | 0.01 |
| Comparative Example 1 | 35 | 67 | 1.4E+13 | 0.40 | HEC | 250,000 | 0.017 | nil | — | — | ammonia | 0.009 |
| Comparative Example 2 | 35 | 67 | 1.4E+13 | 0.40 | HEC | 250,000 | 0.017 | nil | — | — | ammonia | 0.009 |

TABLE 1-continued

| | | | | | | | | | | | | |
|---|---|---|---|---|---|---|---|---|---|---|---|---|
| Comparative Example 3 | 35 | 67 | 1.4E+13 | 0.40 | HEC | 250,000 | 0.017 | nil | — | — | ammonia | 0.009 |
| Comparative Example 4 | 35 | 67 | 1.4E+13 | 0.40 | HEC | 250,000 | 0.017 | nil | — | — | ammonia | 0.009 |

| | Polishing Composition Specific gravity [g/mL] | Surface treatment | | | | | | | |
|---|---|---|---|---|---|---|---|---|---|
| | | Silica | | | | | | Water-soluble polymer | |
| | | Aberage primary particle diameter [nm] | Light scattering particle diameter [nm] | Number of particles [particles/cm³] | Concentration [wt %] | Number ratio (surface treatment/polishing) | Concentration ratio (surface treatment/polishing) | Kind | Weight average molecular weight | Concentration [wt %] |
| Example 1 | 1.003 | 35 | 67 | 7.6E+11 | 0.02 | 0.05 | 0.05 | HEC | 1,000,000 | 0.013 |
| Example 2 | 1.003 | 35 | 67 | 1.5E+12 | 0.04 | 0.11 | 0.11 | HEC | 1,000,000 | 0.026 |
| Example 3 | 1.001 | 12 | 21 | 7.6E+11 | 0.001 | 0.05 | 0.004 | HEC | 1,000,000 | 0.013 |
| Example 4 | 1.003 | 35 | 67 | 7.6E+11 | 0.02 | 0.002 | 0.054 | HEC | 1,000,000 | 0.013 |
| Example 5 | 1.006 | 35 | 67 | 1.5E+12 | 0.04 | 0.05 | 0.05 | HEC | 1,000,000 | 0.013 |
| Example 6 | 1.003 | 35 | 67 | 1.5E+12 | 0.04 | 0.11 | 0.11 | HEC PVA | 1,000,000 100,000 | 0.0065 0.0195 |
| Example 7 | 1.003 | 35 | 67 | 1.5E+12 | 0.04 | 0.11 | 0.11 | HEC PVA | 1,000,000 10,000 | 0.0065 0.0195 |
| Example 8 | 1.003 | 35 | 67 | 1.5E+12 | 0.04 | 0.11 | 0.11 | HEC PVA | 1,000,000 100,000 | 0.0065 0.0195 |
| Example 9 | 1.003 | 35 | 67 | 1.5E+12 | 0.04 | 0.11 | 0.11 | PACMO PVA | 600,000 100,000 | 0.002 0.008 |
| Comparative Example 1 | 1.003 | — | — | nil | — | 0.00 | 0.00 | HEC | 1,000,000 | 0.013 |
| Comparative Example 2 | 1.003 | — | — | nil | — | 0.00 | 0.00 | HEC | 1,200,000 | 0.013 |
| Comparative Example 3 | 1.003 | — | — | nil | — | 0.00 | 0.00 | nil | — | — |
| Comparative Example 4 | 1.003 | 35 | 67 | 1.4E+13 | 0.40 | 1.00 | 1.00 | HEC | 250,000 | 0.017 |

| | Surface treatment | | | | | Surface wettability | Defect |
|---|---|---|---|---|---|---|---|
| | Surfactant | | | Basic compound | | area rate | performance |
| | | Weight | | | | of wafer | SP2 37 nm |
| | Kind | average molecular weight | Concentration [wt %] | Kind | Concentration [wt %] | Composition Specific gravity [g/mL] | hydrophilic part after polishing | or more number of defects |
| Example 1 | nil | — | — | ammonia | 0.005 | 1.000 | 100 | 80 |
| Example 2 | nil | — | — | ammonia | 0.010 | 1.000 | 100 | 85 |
| Example 3 | nil | — | — | ammonia | 0.005 | 1.000 | 95 | 80 |
| Example 4 | nil | — | — | ammonia | 0.005 | 1.000 | 100 | 95 |
| Example 5 | nil | — | — | ammonia | 0.005 | 1.000 | 100 | 90 |
| Example 6 | nil | — | — | ammonia | 0.005 | 1.000 | 100 | 80 |
| Example 7 | nil | — | — | ammonia | 0.005 | 1.000 | 100 | 75 |
| Example 8 | C10PEO5 | 378 | 0.001 | ammonia | 0.005 | 1.000 | 100 | 75 |
| Example 9 | nil | — | — | ammonia | 0.005 | 1.000 | 90 | 70 |
| Comparative Example 1 | nil | — | — | ammonia | 0.005 | 1.000 | 80 | 115 |
| Comparative Example 2 | nil | — | — | ammonia | 0.0005 | 1.000 | 85 | 135 |
| Comparative Example 3 | nil | — | — | nil | — | 1.000 | 50 | 200 |
| Comparative Example 4 | nil | — | — | ammonia | 0.009 | 1.003 | 100 | 100 |

PACMO: polyacryloyl morpholine (Conditions in Polishing Step)

The load was set to 15 kPa using as a polishing machine, the single wafer polishing machine, type "PNX-332B" manufactured by Okamoto Machine Tool Works, Ltd. A polishing treatment was conducted for 120 seconds assuming that a surface-plate rotational speed was 30 rpm, a head rotational speed was 30 rpm, the supply speed of a composition was 2.0 liter/minute (free-flowing), and the temperature of a polishing composition was 20° C.

(Conditions in Surface Treatment Step)

Using as the polishing machine, the same "PNX-332B" manufactured by the same Okamoto Machine Tool Works, Ltd as in the polishing step, the load was changed to 8 kPa on the same surface plate, following the polishing step, and a surface treatment was conducted for 20 seconds assuming that the surface-plate rotational speed was 30 rpm, the head rotational speed was 30 rpm, the supply speed of a composition was 2.0 liter/minute (free-flowing), and the temperature of a surface treatment composition was 20° C.

(Cleaning Conditions)

A silicon wafer after the surface treatment was cleaned using a cleaning liquid having $NH_4OH$ (29%):$H_2O_2$ (31%): deionized water (DIW)=1:3:30 (volume ratio) (SC-1 cleaning). At this time, cleaning tanks each equipped with an ultrasonic oscillator having a frequency of 950 kHz were prepared two. The above cleaning liquid was contained in each of those first and second cleaning tanks and held at 60° C. The silicon wafer after the surface treatment was immersed in the first cleaning tank for 6 minutes and subsequently in the second cleaning tank for 6 minutes through a rinsing tank by ultrapure water and ultrasound, in a state in which the above ultrasonic oscillator has been operated, respectively.

(Evaluation Method)

After the polishing treatment, the surface treatment and the cleaning have been conducted under the above conditions, the area in which a silicon wafer surface being made hydrophilic was visually evaluated. As the number of defects, the number (LPD number) of particles each having a size of 37 nm or more, which exist in the surface of the post-polishing silicon wafer being 300 mm in diameter, was counted using the wafer inspecting apparatus, commodity name "SurfscanSP2" manufactured by KLA-Tencor Co., Ltd. A result is illustrated in Table 1.

As illustrated in Table 1, in examples 1 through 9 in which the number of abrasives in the surface treatment composition in the surface treatment step is assumed to be $7.6\times10^{11}$~$1.5\times10^{12}/cm^3$, it was possible to confirm that the number of defects was greatly reduced as compared with comparative examples 1 through 3 in which abrasives were not contained in the surface treatment composition and a comparative example 4 in which abrasives were contained in the surface treatment composition by $1.4\times10^{13}$.

The invention claimed is:

1. A method of polishing a silicon wafer, wherein the method comprises a polishing step and a surface treatment step performed after the polishing step, wherein:
    a surface treatment composition used in the surface treatment step comprises abrasives;
    an average primary particle diameter of the abrasives in the surface treatment composition is 5 nm or more and 100 nm or less;
    a concentration of the abrasives in the surface treatment composition is 0.000005 wt % or more and 0.05 wt % or less;
    a polishing composition used in the polishing step comprises abrasives;
    an average primary particle diameter of the abrasives in the polishing composition is 5 nm or more and 100 nm or less;
    a concentration of the abrasives in the polishing composition is 0.1 wt % or more and 10 wt % or less; and
    a value obtained by dividing the concentration of the abrasives in the surface treatment composition used in the surface treatment step by the concentration of the abrasives in the polishing composition is 0.00001 or more and 0.11 or less.

2. The method of polishing a silicon wafer according to claim 1, wherein the concentration of the abrasives in the surface treatment composition is 0.00001 wt % or more and 0.05 wt % or less.

3. The method of polishing a silicon wafer according to claim 1, wherein the polishing step and the surface treatment step are steps continuously carried out on a same surface plate.

4. The method of polishing a silicon wafer according to claim 1, wherein the abrasives contain colloidal silica manufactured by a sol-gel method.

5. The surface treatment composition used in the method of polishing a silicon wafer according to claim 1.

6. A method of polishing a silicon wafer, comprising a polishing step and a surface treatment step performed after the polishing step, wherein:
    a surface treatment composition used in the surface treatment step comprises abrasives and a water-soluble polymer;
    an average primary particle diameter of the abrasives in the surface treatment composition is 5 nm or more and 100 nm or less;
    a concentration of the abrasives in the surface treatment composition is 0.000005 wt % or more and 0.05 wt % or less;
    the water-soluble polymer is a cellulose derivative, a polyvinyl alcohol, a polyacryloyl morpholine, or a combination thereof,
    a polishing composition used in the polishing step comprises abrasives;
    an average primary particle diameter of the abrasives in the polishing composition is 5 nm or more and 100 nm or less; and
    a concentration of the abrasives in the polishing composition is 0.1 wt % or more and 10 wt % or less,
    wherein a value obtained by dividing the concentration of the abrasives in the surface treatment composition used in the surface treatment step by the concentration of the abrasives in the polishing composition is 0.00001 or more and 0.5 or less.

7. The method of polishing a silicon wafer according to claim 6, wherein the concentration of the abrasives in the surface treatment composition is 0.00001 wt % or more and 0.05 wt % or less.

8. The method of polishing a silicon wafer according to claim 6, wherein the polishing composition comprises a water-soluble polymer, and the water-soluble polymer is a cellulose derivative, a polyvinyl alcohol, a polyacryloyl morpholine, or a combination thereof.

9. The method of polishing a silicon wafer according to claim 8, wherein the surface treatment composition comprises a surfactant.

10. The method of polishing a silicon wafer according to claim 8, wherein the polishing composition comprises a surfactant.

11. The method of polishing a silicon wafer according to claim 9, wherein the polishing composition comprises a surfactant.

12. The method of polishing a silicon wafer according to claim 6, wherein the polishing step and the surface treatment step are steps continuously carried out on a same surface plate.

13. The method of polishing a silicon wafer according to claim 6, wherein the abrasives contain colloidal silica manufactured by a sol-gel method.

14. The surface treatment composition used in the method of polishing a silicon wafer according to claim 6.

* * * * *